(12) United States Patent
Shen (10) Patent No.: US 8,076,775 B2
(45) Date of Patent: Dec. 13, 2011

(54) SEMICONDUCTOR PACKAGE AND METHOD FOR MAKING THE SAME

(76) Inventor: Yu-Nung Shen, Taipei (TW)

( * ) Notice: Subject to any disclaimer, the term of this patent is extended or adjusted under 35 U.S.C. 154(b) by 73 days.

(21) Appl. No.: 12/357,334

(22) Filed: Jan. 21, 2009

(65) Prior Publication Data

US 2009/0194863 A1 Aug. 6, 2009

(30) Foreign Application Priority Data

Feb. 1, 2008 (TW) ................................ 97104403 A (51) Int. Cl.
*H01L 23/04* (2006.01)
(52) U.S. Cl. . 257/730; 257/686; 257/774; 257/E23.023; 257/E23.069; 257/E23.125; 438/106; 438/127; 361/777
(58) Field of Classification Search .............. 257/686, 257/678, 690, 692, 693, 701, 730, 774, E23.061, 257/E25.023, E23.069, E23.125; 438/106, 438/109, 110, 125, 126, 127; 361/777
See application file for complete search history.

(56) References Cited

U.S. PATENT DOCUMENTS

| 5,888,884 | A | * | 3/1999 | Wojnarowski | 438/462 |
| 7,045,899 | B2 | * | 5/2006 | Yamane et al. | 257/777 |
| 7,112,469 | B2 | * | 9/2006 | Mihara | 438/110 |
| 7,633,159 | B2 | * | 12/2009 | Boon et al. | 257/730 |
| 7,790,505 | B2 | * | 9/2010 | Lin et al. | 438/113 |
| 2001/0010627 | A1 | * | 8/2001 | Akagawa | 361/761 |
| 2005/0051886 | A1 | * | 3/2005 | Mihara et al. | 257/690 |
| 2005/0161799 | A1 | * | 7/2005 | Jobetto | 257/690 |
| 2008/0237828 | A1 | * | 10/2008 | Yang | 257/690 |

* cited by examiner

*Primary Examiner* — William D Coleman
*Assistant Examiner* — Su Kim
(74) *Attorney, Agent, or Firm* — Christie, Parker & Hale, LLP (57) ABSTRACT

A semiconductor package includes: a semiconductor substrate; an inner insulator layer formed on the substrate; at least one internal wiring extending from a front side of the substrate along one of lateral sides of the substrate to a rear side of the substrate; a first outer insulator layer disposed at the front side of the substrate, formed on the internal wiring, and formed with at least one wire-connecting hole; and a second outer insulator layer disposed at the rear side of the substrate, formed on the internal wiring, and formed with at least one wire-connecting hole which exposes a portion of the internal wiring.

7 Claims, 8 Drawing Sheets

SEMICONDUCTOR PACKAGE AND METHOD FOR MAKING THE SAME

CROSS-REFERENCE TO RELATED APPLICATION

This application claims priority of Taiwanese application no. 097104403, filed on Feb. 1, 2008.

BACKGROUND OF THE INVENTION

1. Field of the Invention

This invention relates to a semiconductor package and a method for making the same, more particularly to a semiconductor package having a wiring extending from a bonding pad along a front side and a lateral side of a semiconductor substrate to a rear side of the semiconductor substrate.

2. Description of the Related Art

Stacked-type semiconductor devices are devices that include stacked semiconductor packages so as to achieve miniaturization purposes for electronic appliances. Hence, there is a need to form a low profile semiconductor package that is suitable for making a low profile stacked-type semiconductor device. In addition, the low profile semiconductor package is required to maintain a high stability in the electrical property thereof.

SUMMARY OF THE INVENTION

Therefore, an object of the present invention is to provide a semiconductor package that has a low profile and a high stability in the electrical property thereof.

Another object of the present invention is to provide a method for making the semiconductor package.

According to one aspect of this invention, a semiconductor package comprises: a semiconductor substrate having front and rear sides, two opposite lateral sides transverse to the front and rear sides, a pad-mounting face disposed at the front side, and at least one bonding pad formed on the pad-mounting face; an inner insulator layer formed on the pad-mounting face and formed with at least one pad-aligned hole that exposes the bonding pad; at least one internal wiring connected to the bonding pad, extending therefrom through the pad-aligned hole to the front side of the semiconductor substrate, and further extending from the front side of the semiconductor substrate along one of the lateral sides of the semiconductor substrate to the rear side of the semiconductor substrate, the internal wiring including a first segment formed on the inner insulator layer, a second segment disposed at the one of the lateral sides of the semiconductor substrate, and a third segment disposed at the rear side of the semiconductor substrate; a first outer insulator layer disposed at the front side of the semiconductor substrate and having a portion that is formed on the first segment of the internal wiring and that is formed with at least one first wire-connecting hole which exposes a portion of the first segment of the internal wiring; and a second outer insulator layer disposed at the rear side of the semiconductor substrate and having a portion that is formed on the third segment of the internal wiring and that is formed with at least one second wire-connecting hole which exposes a portion of the third segment of the internal wiring.

According to another aspect of this invention, a semiconductor package comprises: a semiconductor substrate having a pad-mounting face and at least one bonding pad formed on the pad-mounting face; an inner insulator layer formed on the pad-mounting face and formed with at least one pad-aligned hole that exposes the bonding pad; a wire-defining layer formed on the inner insulator layer and formed with at least one wire-defining hole that exposes a portion of the inner insulator layer and that is in spatial communication with and that is transverse to the pad-aligned hole; at least one internal wiring connected to the bonding pad and extending therefrom through the pad-aligned hole and into the wire-defining hole; and an outer insulator layer formed on the wire-defining layer and the internal wiring and formed with at least one wire-connecting hole which exposes a portion of the internal wiring. The inner insulator layer and the wire-defining layer cooperatively form a structure that has a trapezoidal cross-section.

According to yet another aspect of this invention, a method for making semiconductor packages comprises: forming a first inner insulator layer on a pad-mounting face of a semiconductor substrate; forming a plurality of pad-aligned holes and a plurality of side holes in the first inner insulator layer such that the pad-aligned holes expose bonding pads on the pad-mounting face of the semiconductor substrate, respectively, and that the side holes are disposed respectively at cutting lines of the semiconductor substrate; forming a wire-defining layer on the first inner insulator layer; forming a plurality of wire-defining holes in the wire-defining layer such that each of the wire-defining holes extends between and communicates spatially with a respective one of the pad-aligned holes and a respective one of the side holes; forming a plurality of through-holes in the semiconductor substrate such that each of the through-holes communicates spatially with a respective one of the side holes and extends through a rear face of the semiconductor substrate opposite to the pad-mounting face; forming a plurality of first conductive traces such that each of the first conductive traces fills a respective one of the pad-aligned holes to connect with a respective one of the bonding pads, and further fills a respective one of the wire-defining holes, a respective one of the side holes, and a respective one of the through-holes; forming a second inner insulator layer on the rear face of the semiconductor substrate; forming a plurality of wire-extension holes in the second inner insulator layer such that each of the wire-extension holes communicates spatially with a respective one of the through-holes; forming a plurality of second conductive traces such that each of the second conductive traces fills a respective one of the wire-extension holes to connect with a respective one of the first conductive traces; forming a first outer insulator layer to cover the wire-defining layer and the first conductive traces; forming a plurality of wire-connecting holes in the first outer insulator layer to expose portions of the first conductive traces, respectively; forming a second outer insulator layer to cover the second inner insulator layer and the second conductive traces; forming a plurality of wire-connecting holes in the second outer insulator layer to expose portions of the second conductive traces, respectively; forming a plurality of conductive posts such that each of the conductive posts fills a respective one of the wire-connecting holes in the first outer insulator layer to connect with a respective one of the first conductive traces and extends outwardly of the respective one of the wire-connecting holes in the first outer insulator layer; and cutting an assembly of the first and second inner insulator layers, the first and second outer insulator layers, the wire-defining layer, the first and second conductive traces, the conductive posts, and the semiconductor substrate along the cutting lines so as to form the semiconductor packages.

According to a further aspect of this invention, a method for making semiconductor packages comprises: forming a plurality of upper recesses in a semiconductor substrate such that each of the upper recesses extends through a pad-mounting face of the semiconductor substrate and is disposed at a respective one of cutting lines of the semiconductor substrate; forming a first inner insulator layer on the pad-mounting face of the semiconductor substrate such that the first inner insulator layer fills the upper recesses; forming a plurality of pad-aligned holes in the first inner insulator layer such that the pad-aligned holes expose bonding pads on the pad-mounting face of the semiconductor substrate, respectively, and a plurality of upper side holes in the first inner insulator layer such that the upper side holes are disposed respectively at the cutting lines of the semiconductor substrate, each of the upper side holes being defined by a hole-defining wall that extends into a respective one of the upper recesses; forming a first wire-defining layer on the first inner insulator layer; forming a plurality of first wire-defining holes in the first wire-defining layer such that each of the first wire-defining holes extends between and communicates spatially with a respective one of the pad-aligned holes and a respective one of the upper side holes; forming a plurality of first conductive traces such that each of the first conductive traces fills a respective one of the pad-aligned holes to connect with a respective one of the bonding pads, and further fills a respective one of the first wire-defining holes and a respective one of the upper side holes; forming a plurality of lower recesses in the semiconductor substrate such that each of the lower recesses extends through a rear face of the semiconductor substrate opposite to the pad-mounting face and communicates spatially with a respective one of the upper recesses; forming a second inner insulator layer on the rear face of the semiconductor substrate such that the second inner insulator layer fills the lower recesses; forming a plurality of lower side holes in the second inner insulator layer such that the lower side holes are disposed respectively at the cutting lines of the semiconductor substrate, each of the lower side holes communicating spatially with a respective one of the upper side holes and being defined by a hole-defining wall that extends into a respective one of the lower recesses; forming a second wire-defining layer on the second inner insulator layer; forming a plurality of second wire-defining holes in the second wire-defining layer such that each of the second wire-defining holes communicates spatially with and is transverse to a respective one of the lower side holes; forming a plurality of second conductive traces such that each of the second conductive traces fills a respective one of the second wire-defining holes and a respective one of the lower side holes to connect with a respective one of the first conductive traces; forming a first outer insulator layer to cover the first wire-defining layer and the first conductive traces; forming a plurality of wire-connecting holes in the first outer insulator layer to expose portions of the first conductive traces, respectively; forming a second outer insulator layer to cover the second wire-defining layer and the second conductive traces; forming a plurality of wire-connecting holes in the second outer insulator layer to expose portions of the second conductive traces, respectively; forming a plurality of conductive posts such that each of the conductive posts fills a respective one of the wire-connecting holes in the first outer insulator layer to connect with a respective one of the first conductive traces and extends outwardly of the respective one of the wire-connecting holes in the first outer insulator layer; and cutting an assembly of the first and second inner insulator layers, the first and second outer insulator layers, the first and second wire-defining layers, the first and second conductive traces, the conductive posts, and the semiconductor substrate along the cutting lines so as to form the semiconductor packages.

According to still another aspect of this invention, a method for making semiconductor packages comprises: forming an inner insulator layer on a pad-mounting face of a semiconductor substrate; forming a plurality of pad-aligned holes in the inner insulator layer such that the pad-aligned holes expose bonding pads on the pad-mounting face of the semiconductor substrate, respectively, and a plurality of side holes in the inner insulator layer such that the side holes are disposed respectively at cutting lines of the semiconductor substrate; forming a wire-defining layer on the inner insulator layer; forming a plurality of wire-defining holes in the wire-defining layer such that each of the wire-defining holes extends between a respective one of the pad-aligned holes and a respective one of the side holes and communicates spatially with the respective one of the pad-aligned holes, and a plurality of side through-holes in the wire-defining layer such that each of the side through-holes is disposed at a respective one of the cutting lines and communicates spatially with a respective one of the side holes; forming a plurality of conductive traces such that each of the conductive traces fills a respective one of the pad-aligned holes to connect with a respective one of the bonding pads, and further fills a respective one of the wire-defining holes; forming an outer insulator layer to cover the wire-defining layer and the conductive traces and to fill the side holes and the side through-holes; forming a plurality of wire-connecting holes in the outer insulator layer to expose portions of the conductive traces, respectively; forming a plurality of conductive posts such that each of the conductive posts fills a respective one of the wire-connecting holes in the outer insulator layer to connect with a respective one of the conductive traces and extends outwardly of the respective one of the wire-connecting holes in the outer insulator layer; and cutting an assembly of the inner insulator layer, the outer insulator layer, the wire-defining layer, the conductive traces, the conductive posts, and the semiconductor substrate along the cutting lines so as to form the semiconductor packages. Each of the side holes cooperates with the respective one of the side through-holes to form a hole shape that permits an assembly of the wire-forming layer and the inner insulator layer of each of the semiconductor packages to have a trapezoidal cross-section.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Before the present invention is described in greater detail with reference to the accompanying preferred embodiments, it should be noted herein that like elements are denoted by the same reference numerals throughout the disclosure.

Figure 1:
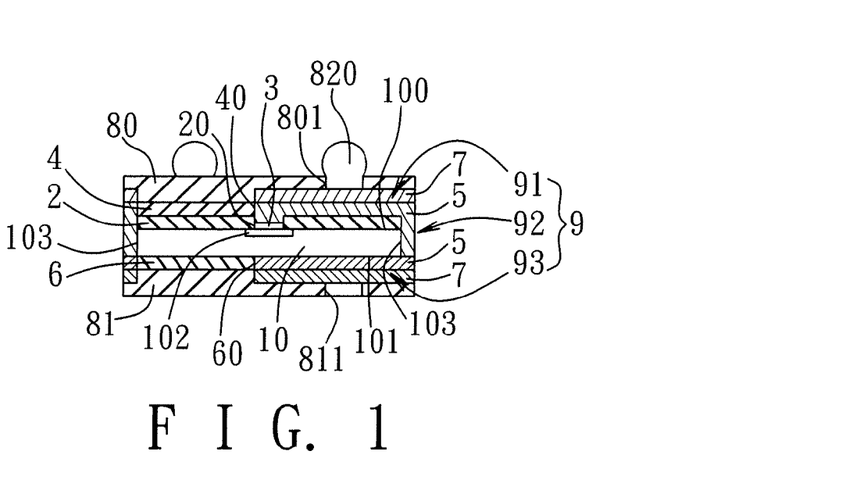
FIG. 1 is a partly sectional view of the first preferred embodiment of a semiconductor package according to this invention.
Figure 2:
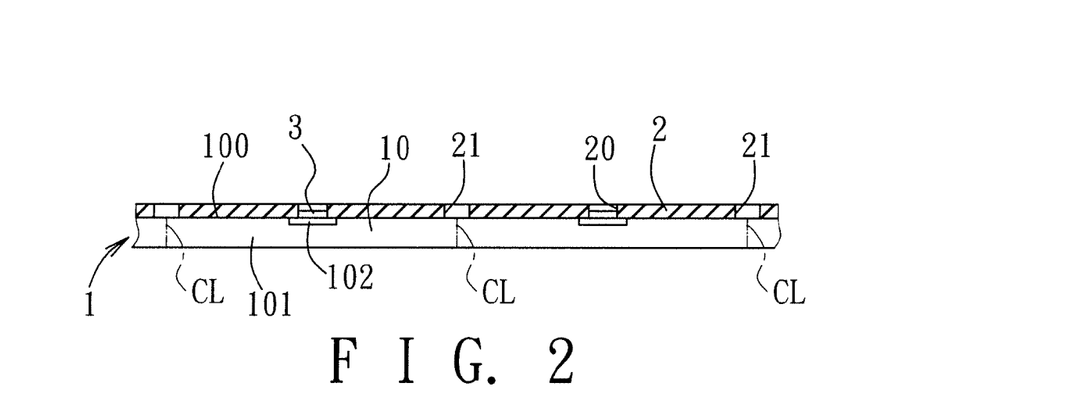
FIGS. 2 to 7 are fragmentary partly sectional views to illustrate consecutive steps of a method for making the semiconductor package of the first preferred embodiment according to this invention.
Figure 3:
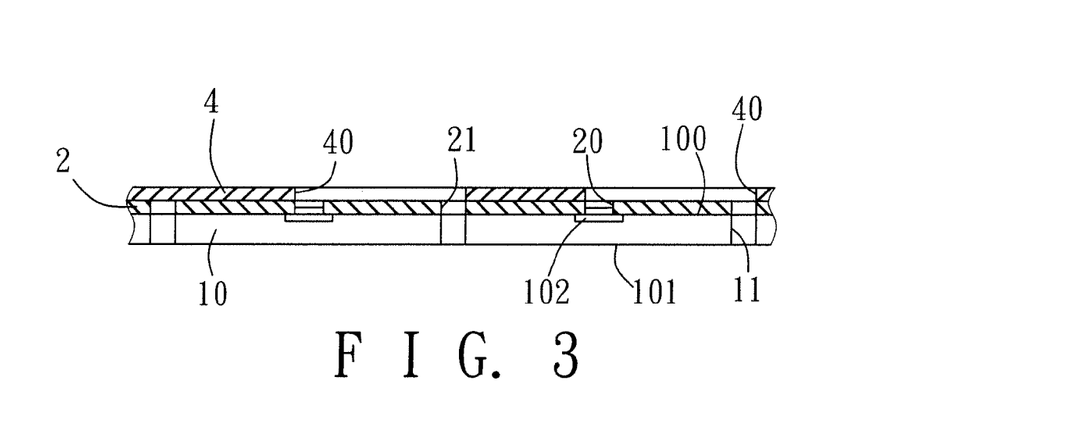
Figure 4:
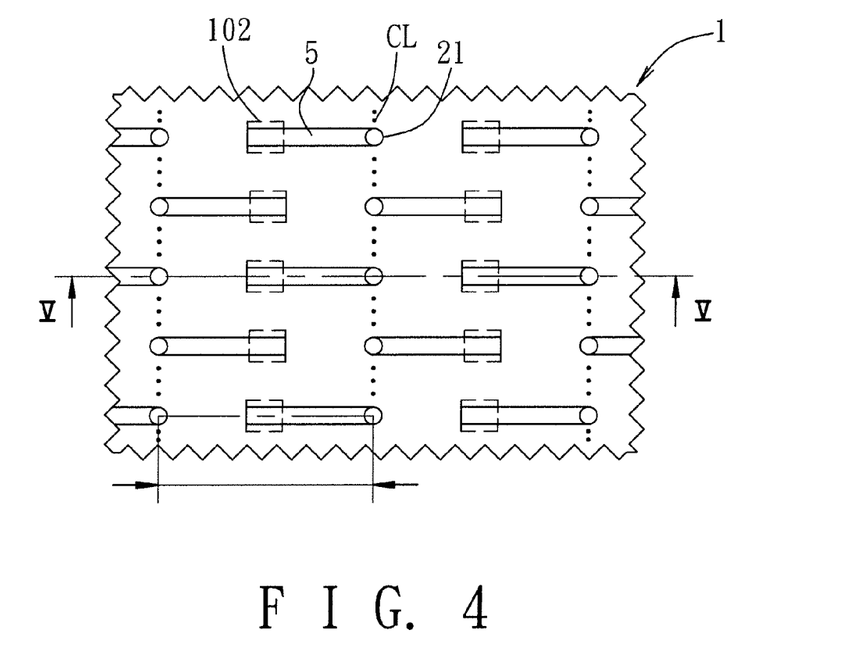
Figure 5:
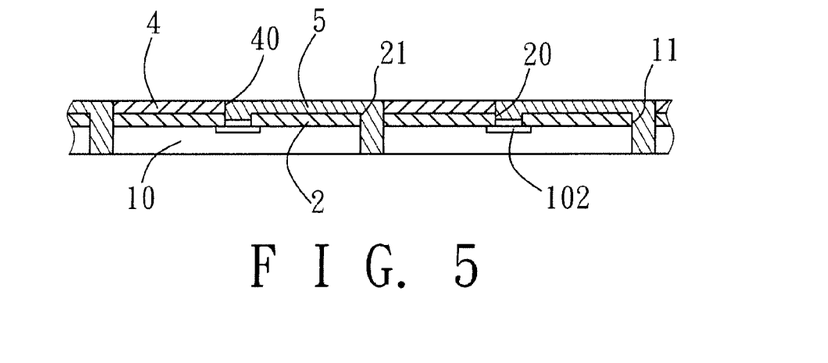
Figure 6:
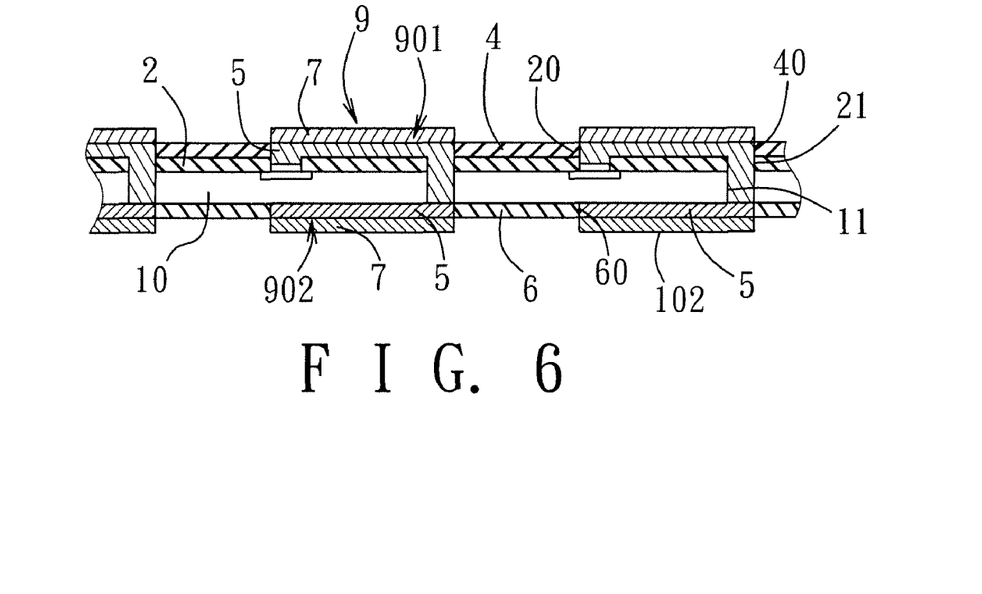
Figure 7:
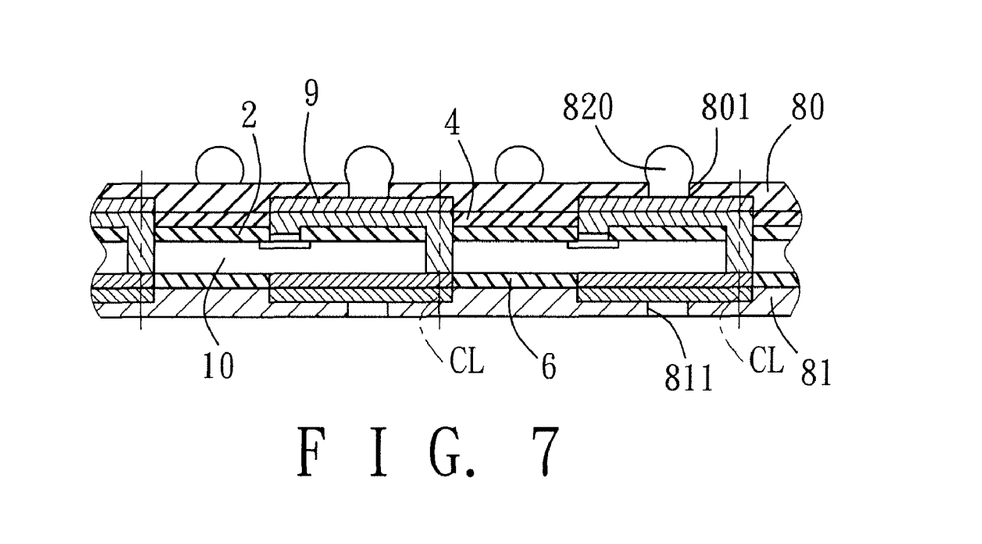

FIG. 1 illustrates the first preferred embodiment of a semiconductor package according to the present invention. The semiconductor package includes: a semiconductor substrate 10 having front and rear sides, two opposite lateral sides transverse to the front and rear sides, a pad-mounting face 100 disposed at the front side, and at least one bonding pad 102 formed on the pad-mounting face 100; a first inner insulator layer 2 formed on the pad-mounting face 100 and formed with at least one pad-aligned hole 20 that exposes the bonding pad 102; at least one internal wiring 9 connected to the bonding pad 102, extending therefrom through the pad-aligned hole 20 to the front side of the semiconductor substrate 10, and further extending from the front side of the semiconductor substrate 10 along one of the lateral sides of the semiconductor substrate 10 to the rear side of the semiconductor substrate 10, the internal wiring 9 including a first segment 91 formed on the first inner insulator layer 2, a second segment 92 disposed at the one of the lateral sides of the semiconductor substrate 10, and a third segment 93 disposed at the rear side of the semiconductor substrate 10; a first outer insulator layer 80 disposed at the front side of the semiconductor substrate 10 and having a portion that is formed on the first segment 91 of the internal wiring 9 and that is formed with at least one first wire-connecting hole 801 which exposes a portion of the first segment 91 of the internal wiring 9; and a second outer insulator layer 81 disposed at the rear side of the semiconductor substrate 10 and having a portion that is formed on the third segment 93 of the internal wiring 9 and that is formed with at least one second wire-connecting hole 811 which exposes a portion of the third segment 93 of the internal wiring 9.

The semiconductor package further includes a wire-defining layer 4 formed on the first inner insulator layer 2 and formed with at least one wire-defining hole 40 that exposes a portion of the first inner insulator layer 2. The first segment 91 of the internal wiring 9 extends into and through the wire-defining hole 40, and is formed on the portion of the first inner insulator layer 2 exposed by the wire-defining hole 40. The first outer insulator layer 80 further has another portion that is formed on the wire-defining layer 4.

The semiconductor substrate 10 further has a rear face 101 disposed at the rear side of the semiconductor substrate 10, and two opposite side faces 103 disposed at the lateral sides, respectively, and interconnecting the pad-mounting face 100 and the rear face 101. In this embodiment, the second segment 92 of the internal wiring 9 is formed on one of the side faces 103 that is disposed at said one of the lateral sides. The third segment 93 of the internal wiring 9 is formed on the rear face 101 of the semiconductor substrate 10.

The semiconductor package further includes a second inner insulator layer 6 that is formed on the rear face 101 of the semiconductor substrate 10 and that is formed with at least one wire-extension hole 60 which exposes a portion of the rear face 101 of the semiconductor substrate 10. The third segment 93 of the internal wiring 9 extends into the wire-extension hole 60, and is formed on the portion of the rear face 101 of the semiconductor substrate 10 exposed by the wire-extension hole 60. The second outer insulator layer 81 further has another portion that is formed on the second inner insulator layer 6.

The semiconductor package further includes at least one conductive post 820 extending outwardly from the first segment 91 of the internal wiring 9 through the first wire-connecting hole 801 in the first outer insulator layer 80.

The first segment 91 of the internal wiring 9 includes a layer of a conductive paste 5 and a layer of a metal 7. The second segment 92 of the internal wiring 91 includes a layer of the conductive paste 5. The third segment 93 of the internal wiring 9 includes a layer of the conductive paste 5 and a layer of the metal 7. The bonding pad 102 is provided with a metal layer 3 thereon. The conductive paste 5 of the first segment 91 of the internal wiring 9 is connected to the metal layer 3. Each of the metal layer and the layer of the metal 7 is preferably a bi-layer structure of Ni/Au.

FIGS. 2 to 7 illustrate consecutive steps of a method for making the semiconductor package of the first preferred embodiment according to this invention.

The method includes the steps of: preparing a wafer 1 that includes the semiconductor substrate 10 having a plurality of cutting lines (CL); forming the first inner insulator layer 2 of an insulator material, such as polyimide, on the pad-mounting face 100 of the semiconductor substrate 10 of the wafer 1 (see FIG. 2) using spinning coating techniques; forming a plurality of the pad-aligned holes 20 and a plurality of side holes 21 in the first inner insulator layer 2 using photolithographic techniques such that the pad-aligned holes 20 expose the bonding pads 102, respectively, and that the side holes 21 are disposed respectively at the cutting lines (CL) (see FIG. 2); forming the wire-defining layer 4 on the first inner insulator layer 2 (see FIG. 2); forming a plurality of the wire-defining holes 40 in the wire-defining layer 4 using photolithographic techniques such that each of the wire-defining holes 40 extends between and communicates spatially with a respective one of the pad-aligned holes 20 and a respective one of the side holes 21 (see FIG. 3); forming a plurality of through-holes 11 in the semiconductor substrate 10 using techniques, such as laser drilling, such that each of the through-holes 11 communicates spatially with a respective one of the side holes 21 and extends through a rear face 101 of the semiconductor substrate 10 opposite to the pad-mounting face 100 (see FIG. 3); forming a plurality of first conductive traces 901 such that each of the first conductive traces 901 fills a respective one of the pad-aligned holes 20 to connect with a respective one of the bonding pads 102, and further fills a respective one of the wire-defining holes 40, a respective one of the side holes 21, and a respective one of the through-holes 11 (see FIGS. 4 to 6); polishing the rear face 101 of the semiconductor substrate 10 and forming the second inner insulator layer 6 on the rear face 101 of the semiconductor substrate 10 (see FIG. 6); forming a plurality of the wire-extension holes 60 in the second inner insulator layer 6 using photolithographic techniques such that each of the wire-extension holes 60 communicates spatially with a respective one of the through-holes 11 (see FIG. 6); forming a plurality of second conductive traces 902 such that each of the second conductive traces 902 fills a respective one of the wire-extension holes 60 to connect with a respective one of the first conductive traces 901 so as to form the internal wiring 9 of each semiconductor package (see FIG. 6); forming the first outer insulator layer 80 to cover the wire-defining layer 4 and the first conductive traces 901 (see FIG. 7); forming a plurality of the first wire-connecting holes 801 in the first outer insulator layer 80 using photolithographic techniques to expose portions of the first conductive traces 901, respectively (see FIG. 7); forming the second outer insulator layer 81 to cover the second inner insulator layer 6 and the second conductive traces 902 (see FIG. 7); forming a plurality of the second wire-connecting holes 811 in the second outer insulator layer 81 using photolithographic techniques to expose portions of the second conductive traces 902, respectively (see FIG. 7); forming a plurality of the conductive posts 820 such that each of the conductive posts 820 fills a respective one of the first wire-connecting holes 801 in the first outer insulator layer 80 to connect with a respective one of the first conductive traces 901 and extends outwardly of the respective one of the first wire-connecting holes 801 in the first outer insulator layer 80 (see FIG. 7); and cutting an assembly of the first and second inner insulator layers 2, 6, the first and second outer insulator layers 80, 81, the wire-defining layer 4, the first and second conductive traces 901, 902, the conductive posts 820, and the semiconductor substrate 10 along the cutting lines (CL) so as to form the semiconductor packages.

Each of the first conductive traces 901 is formed by filling the respective one of the pad-aligned holes 20, the respective one of the wire-defining holes 40, the respective one of the side holes 21, and the respective one of the through-holes 11 (see FIGS. 4 to 6) with the conductive paste 5, followed by forming the layer of the metal 7 on a portion of the conductive paste 5 that fills the respective one of the pad-aligned holes 20 and the respective one of the wire-defining holes 40. Each of the second conductive traces 902 is formed by filling the respective one of the wire-extension holes 60 with the conductive paste 5, followed by forming the layer of the metal 7 on the conductive paste 5. The metal layer 3 is formed on each of the bonding pads 102 prior to formation of the wire-defining layer 4.

Figure 8:
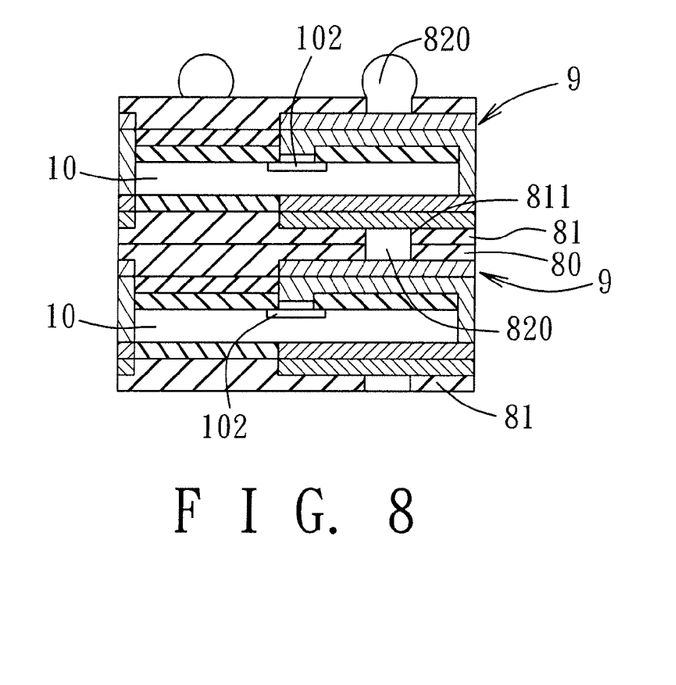
FIG. 8 is a partly sectional view of a stacked-type semiconductor device formed by stacking two of the semiconductor packages of the first preferred embodiment.

FIG. 8 illustrates a configuration of a stacked-type semiconductor device formed by stacking two of the semiconductor packages of the first preferred embodiment. The conductive post 820 of one of the semiconductor packages extends into the second wire-connecting hole 811 in the second outer insulator layer 81 of the other of the semiconductor packages to connect with the internal wiring 9 of the other of the semiconductor packages.

Figure 9:
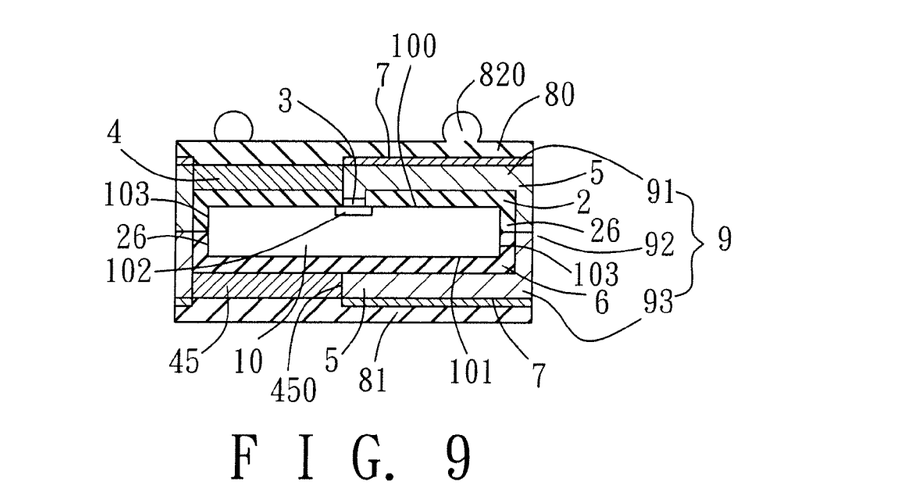
FIG. 9 is a partly sectional view of the second preferred embodiment of the semiconductor package according to this invention.
Figure 10:
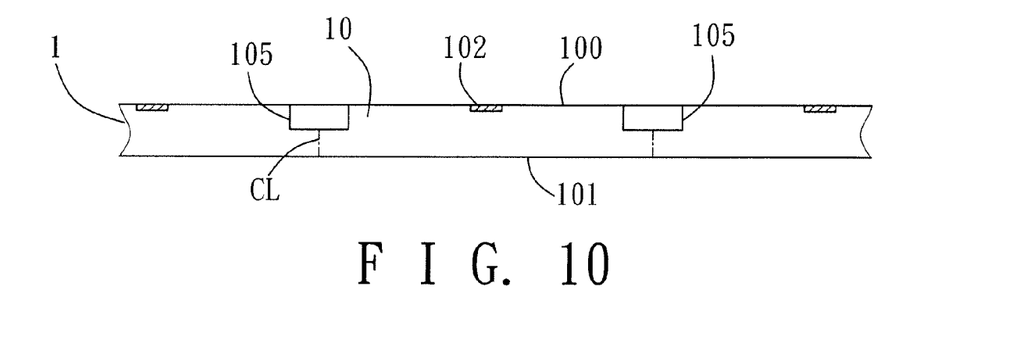
FIGS. 10 to 14 are fragmentary partly sectional views to illustrate consecutive steps of a method for making the semiconductor package of the second preferred embodiment according to this invention.
Figure 11:
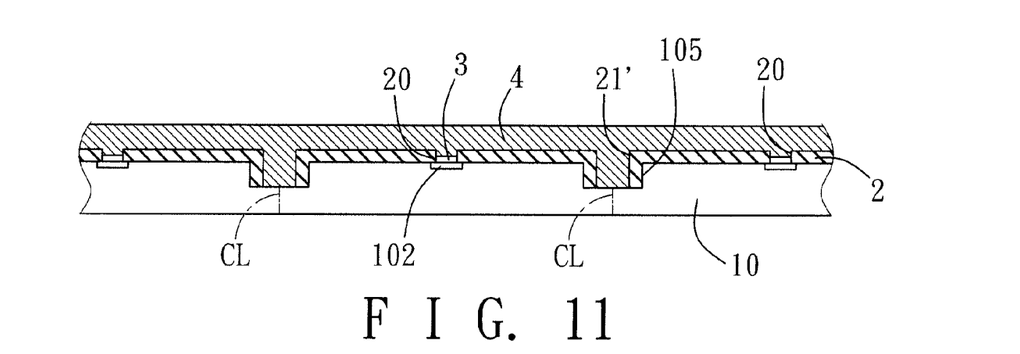
Figure 12:
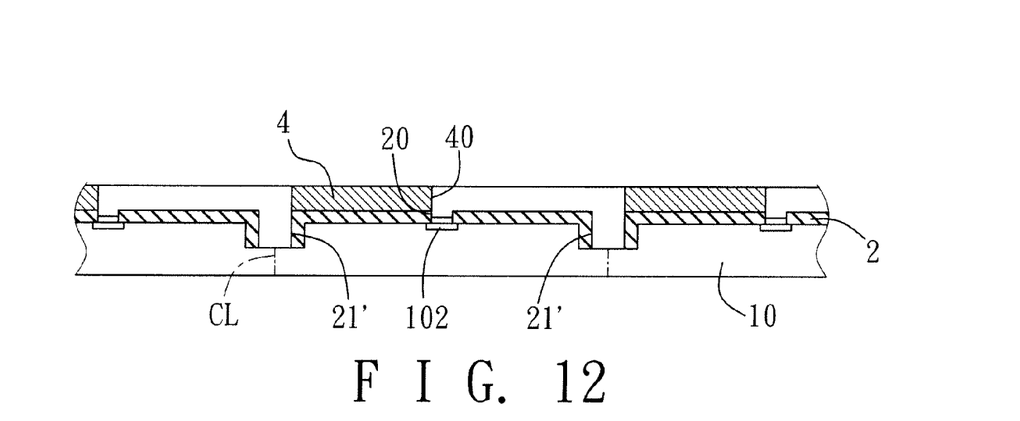
Figure 13:
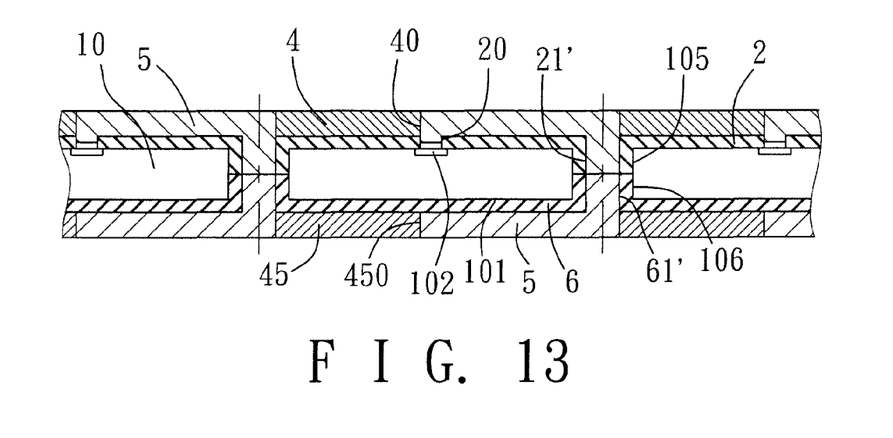
Figure 14:
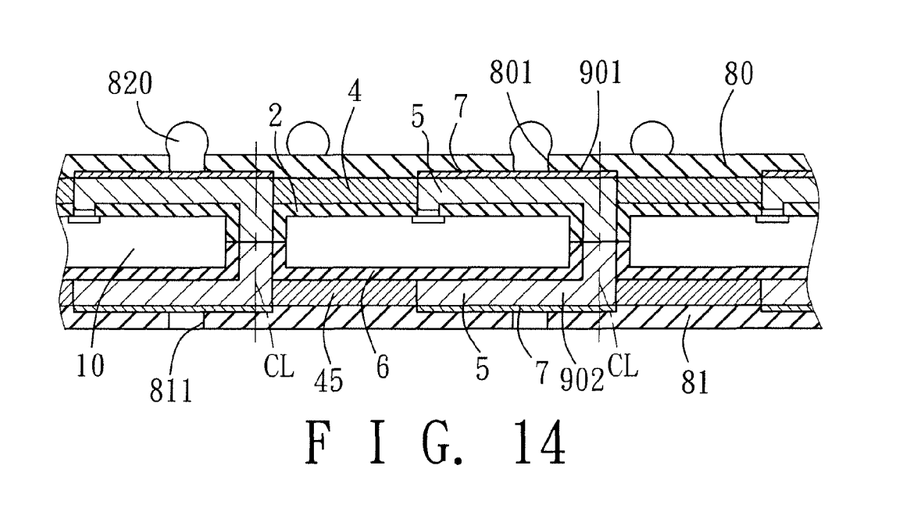

FIG. 9 illustrates the second preferred embodiment of the semiconductor package according to the present invention. The second preferred embodiment differs from the previous embodiment in that the pad-mounting face 100 and portions of the side faces 103 of the semiconductor substrate 10 are covered by the first inner insulator layer 2, and that the rear face 101 and the remainder of the side faces 103 of the semiconductor substrate 10 are covered by the second inner insulator layer 6. The first and second inner insulator layers 2, 6 cooperatively define two opposite side insulator layers 26 formed on the side faces 103 of the semiconductor substrate 10, respectively. As such, in this embodiment, the second segment 92 of the internal wiring 9 is formed on one of the side insulator layers 26 that is disposed at said one of the lateral sides of the semiconductor substrate 10, and the third segment 93 of the internal wiring 9 is formed on the second inner insulator layer 6.

In this embodiment, the semiconductor package further includes a second wire-defining layer 45 formed on the second inner insulator layer 6 and formed with at least one second wire-defining hole 450 that exposes a portion of the second inner insulator layer 6. The third segment 93 of the internal wiring 9 extends into and through the second wire-defining hole 450 in the second wire-defining layer 45, and is formed on the portion of the second inner insulator layer 6 exposed by the second wire-defining hole 450. The second outer insulator layer 81 further has another portion that is formed on the second wire-defining layer 45.

FIGS. 10 to 14 illustrate consecutive steps of a method for making the semiconductor package of the second preferred embodiment according to this invention.

The method includes the steps of: forming a plurality of upper recesses 105 in the semiconductor substrate 10 of the wafer 1 such that each of the upper recesses 105 extends through the pad-mounting face 100 of the semiconductor substrate 10 and is disposed at a respective one of the cutting lines (CL) of the semiconductor substrate 10 (see FIG. 10); forming the first inner insulator layer 2 on the pad-mounting face 100 of the semiconductor substrate such that the first inner insulator layer 2 fills the upper recesses 105 (see FIG. 11); forming a plurality of the pad-aligned holes 20 in the first inner insulator layer 2 such that the pad-aligned holes 20 expose the bonding pads 102, respectively, and a plurality of upper side holes 21' in the first inner insulator layer 2 such that the upper side holes 21' are disposed respectively at the cutting lines (CL) of the semiconductor substrate 10, each of the upper side holes 21' being defined by a hole-defining wall that extends into a respective one of the upper recesses 105 (see FIG. 11); forming the first wire-defining layer 4 on the first inner insulator layer 2 (see FIG. 12); forming a plurality of the first wire-defining holes 40 in the first wire-defining layer 4 such that each of the first wire-defining holes 40 extends between and communicates spatially with a respective one of the pad-aligned holes 20 and a respective one of the upper side holes 21' (see FIG. 12); forming a plurality of first conductive traces 901 such that each of the first conductive traces 901 fills a respective one of the pad-aligned holes 20 to connect with a respective one of the bonding pads 102, and further fills a respective one of the first wire-defining holes 40 and a respective one of the upper side holes 21' (see FIGS. 13 and 14); forming a plurality of lower recesses 106 in the semiconductor substrate 10 such that each of the lower recesses 106 extends through the rear face 101 of the semiconductor substrate 10 and communicates spatially with a respective one of the upper recesses 105 (see FIG. 13); forming the second inner insulator layer 6 on the rear face 101 of the semiconductor substrate 10 such that the second inner insulator layer 6 fills the lower recesses 106 (see FIG. 13); forming a plurality of lower side holes 61' in the second inner insulator layer 6 such that the lower side holes 61' are disposed respectively at the cutting lines (CL) of the semiconductor substrate 10, each of the lower side holes 61' communicating spatially with a respective one of the upper side holes 21' and being defined by a hole-defining wall that extends into a respective one of the lower recesses 106 (see FIG. 13); forming the second wire-defining layer 45 on the second inner insulator layer 6 (see FIG. 13); forming a plurality of the second wire-defining holes 450 in the second wire-defining layer 45 such that each of the second wire-defining holes 450 communicates spatially with and is transverse to a respective one of the lower side holes 61' (see FIG. 13); forming a plurality of second conductive traces 902 such that each of the second conductive traces 902 fills a respective one of the second wire-defining holes 450 and a respective one of the lower side holes 61' to connect with a respective one of the first conductive traces 901 (see FIG. 14); forming the first outer insulator layer 80 to cover the first wire-defining layer 4 and the first conductive traces 901 (see FIG. 14); forming a plurality of the first wire-connecting holes 801 in the first outer insulator layer 80 to expose portions of the first conductive traces 901, respectively (see FIG. 14); forming a second outer insulator layer 81 to cover the second wire-defining layer 45 and the second conductive traces 902 (see FIG. 14); forming a plurality of wire-connecting holes 811 in the second outer insulator layer 81 to expose portions of the second conductive traces 902, respectively (see FIG. 14); forming a plurality of conductive posts 820 such that each of the conductive posts 820 fills a respective one of the first wire-connecting holes 801 in the first outer insulator layer 80 to connect with a respective one of the first conductive traces 901 and extends outwardly of the respective one of the first wire-connecting holes 801 in the first outer insulator layer 80 (see FIG. 14); and cutting an assembly of the first and second inner insulator layers 2, 6, the first and second outer insulator layers 80, 81, the first and second wire-defining layers 4, 45, the first and second conductive traces 901, 902, the conductive posts 820, and the semiconductor substrate 10 along the cutting lines (CL) so as to form the semiconductor packages.

Figure 15:
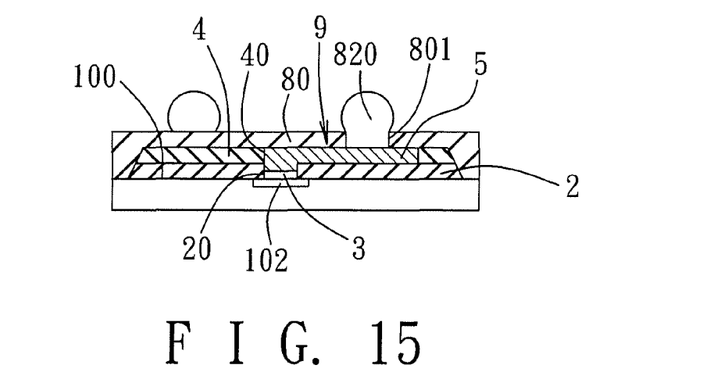
FIG. 15 is a partly sectional view of the third preferred embodiment of the semiconductor package according to this invention.
Figure 16:
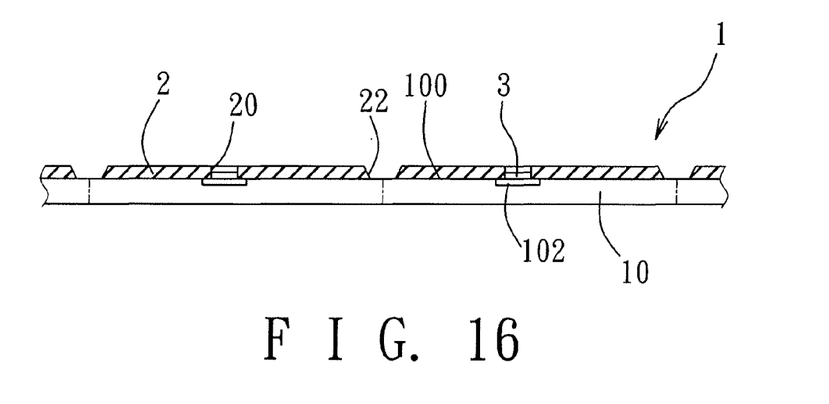
FIGS. 16 to 18 are fragmentary partly sectional views to illustrate consecutive steps of a method for making the semiconductor package of the third preferred embodiment according to this invention.
Figure 17:
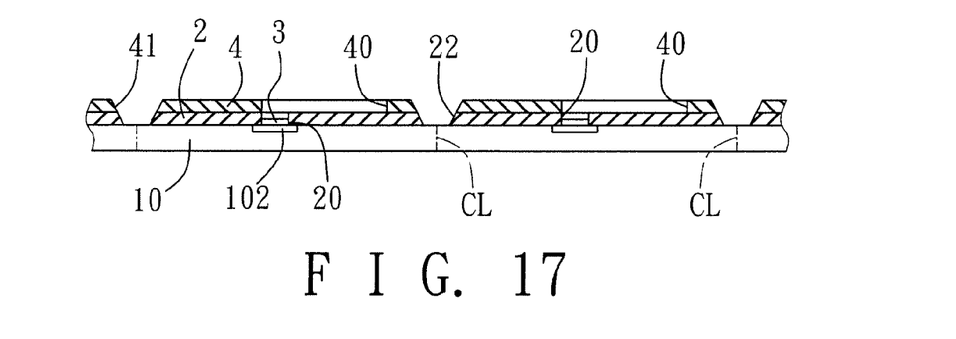
Figure 18:
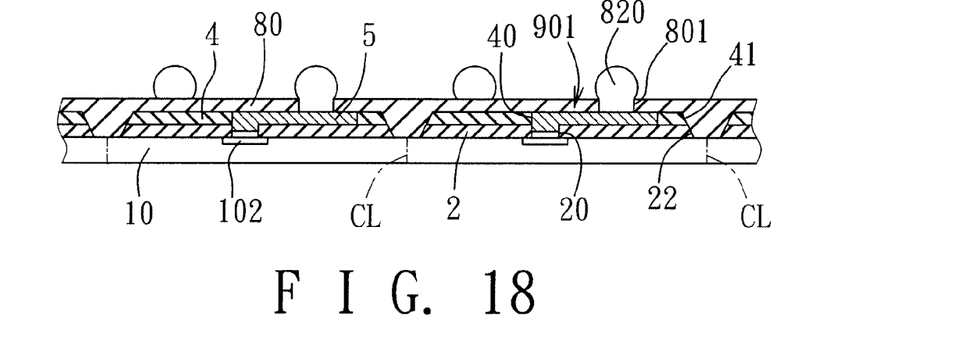

FIG. 15 illustrates the third preferred embodiment of the semiconductor package according to the present invention. The semiconductor package of the third preferred embodiment includes: a semiconductor substrate 10 having a pad-mounting face 100 and at least one bonding pad 102 formed on the pad-mounting face 100; an inner insulator layer 2 formed on the pad-mounting face 100 and formed with at least one pad-aligned hole 20 that exposes the bonding pad 102; a wire-defining layer 4 formed on the inner insulator layer 2 and formed with at least one wire-defining hole 40 that exposes a portion of the inner insulator layer 2 and that is in spatial communication with and that is transverse to the pad-aligned hole 20; at least one internal wiring 9 connected to the bonding pad 102 and extending therefrom through the pad-aligned hole 20 and into the wire-defining hole 40; and an outer insulator layer 80 formed on the wire-defining layer 4 and the internal wiring 9 and formed with at least one wire-connecting hole 801 which exposes a portion of the internal wiring 9. The inner insulator layer 2 and the wire-defining layer 4 cooperatively form a structure that has a trapezoidal cross-section.

The bonding pad 102 is provided with a metal layer 3 that is connected to the internal wiring 9. The internal wiring 9 includes a layer of a conductive paste 5.

FIGS. 16 to 19 illustrate consecutive steps of a method for making the semiconductor package of the third preferred embodiment according to this invention.

The method includes the steps of: forming the inner insulator layer 2 on the pad-mounting face 100 of the semiconductor substrate 10 of the wafer 1 (see FIG. 16) using spinning coating techniques; forming a plurality of the pad-aligned holes 20 in the inner insulator layer 2 such that the pad-aligned holes 20 expose bonding pads 102 on the pad-mounting face 100 of the semiconductor substrate 10, respectively, and a plurality of side holes 22 in the inner insulator layer 2 such that the side holes 22 are disposed respectively at cutting lines (CL) of the semiconductor substrate 10 using photolithographic techniques (see FIG. 16); forming a metal layer 3 on each of the bonding pads 102 (see FIG. 16); forming the wire-defining layer 4 on the inner insulator layer 2 (see FIG. 17); forming a plurality of the wire-defining holes 40 in the wire-defining layer 4 such that each of the wire-defining holes 40 extends between a respective one of the pad-aligned holes 20 and a respective one of the side holes 22 and communicates spatially with the respective one of the pad-aligned holes 20, and a plurality of side through-holes 41 in the wire-defining layer 4 such that each of the side through-holes 41 is disposed at a respective one of the cutting lines (CL) and communicates spatially with a respective one of the side holes 22 (see FIG. 17); forming a plurality of conductive traces 901 of the conductive paste 5 such that each of the conductive traces 901 fills a respective one of the pad-aligned holes 20 to connect with a respective one of the bonding pads 102, and further fills a respective one of the wire-defining holes 40 (see FIG. 18); forming an outer insulator layer 80 to cover the wire-defining layer 4 and the conductive traces 901 and to fill the side holes 22 and the side through-holes 41; forming a plurality of wire-connecting holes 801 in the outer insulator layer 80 to expose portions of the conductive traces 901, respectively (see FIG. 18); forming a plurality of conductive posts 820 such that each of the conductive posts 820 fills a respective one of the wire-connecting holes 801 in the outer insulator layer 80 to connect with a respective one of the conductive traces 901 and extends outwardly of the respective one of the wire-connecting holes 801 in the outer insulator layer 80 (see FIG. 18); and cutting an assembly of the inner insulator layer 2, the outer insulator layer 80, the wire-defining layer 4, the conductive traces 901, the conductive posts 820, and the semiconductor substrate 10 along the cutting lines (CL) so as to form the semiconductor packages. Each of the side holes 22 cooperates with the respective one of the side through-holes 41 to form a hole shape that permits an assembly of the wire-forming layer 4 and the inner insulator layer 2 of each of the semiconductor packages to have a trapezoidal cross-section.

By forming the internal wiring 9, which extends from the bonding pad 102 along the front side and the lateral side of the semiconductor substrate 10 to the rear side of the semiconductor substrate 10, the semiconductor package thus formed can achieve a relatively low profile configuration and a high stability in the electrical property thereof and thus achieve the miniaturization of the stacked-type semiconductor device.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A semiconductor package comprising:
   a semiconductor substrate having front and rear sides, two opposite lateral sides transverse to said front and rear sides, a pad-mounting face disposed at said front side, and at least one bonding pad formed on said pad-mounting face;
   a first inner insulator layer formed on said pad-mounting face and formed with at least one pad-aligned hole that exposes said bonding pad;
   at least one internal wiring connected to said bonding pad, extending therefrom through said pad-aligned hole to said front side of said semiconductor substrate, and further extending from said front side of said semiconductor substrate along one of said lateral sides of said semiconductor substrate to said rear side of said semiconductor substrate, said internal wiring including a first segment formed on said first inner insulator layer, a second segment disposed at said one of said lateral sides of said semiconductor substrate, and a third segment disposed at said rear side of said semiconductor substrate;
   a first outer insulator layer disposed at said front side of said semiconductor substrate and having a portion that is formed on said first segment of said internal wiring and that is formed with at least one first wire-connecting hole which exposes a portion of said first segment of said internal wiring;
   a second outer insulator layer disposed at said rear side of said semiconductor substrate and having a portion that is formed on said third segment of said internal wiring and that is formed with at least one second wire-connecting hole which exposes a portion of said third segment of said internal wiring;

a wire-defining layer formed on said first inner insulator layer and formed with at least one wire-defining hole that exposes a portion of said first inner insulator layer, said first segment of said internal wiring extending into and through said wire-defining hole and being formed on said portion of said first inner insulator layer exposed by said wire-defining hole, said first outer insulator layer further having another portion that is formed on said wire-defining layer, wherein said semiconductor substrate further has a rear face disposed at said rear side of said semiconductor substrate, and two opposite side faces disposed at said lateral sides, respectively, and interconnecting said pad-mounting face and said rear face, said second segment of said internal wiring being formed on one of said side faces that is disposed at said one of said lateral sides, said third segment of said internal wiring being formed on said rear face of said semiconductor substrate; and a second inner insulator layer that is formed on said rear face of said semiconductor substrate and that is formed with at least one wire-extension hole which exposes a portion of said rear face of said semiconductor substrate, said third segment of said internal wiring extending into said wire-extension hole and being formed on said portion of said rear face of said semiconductor substrate exposed by said wire-extension hole, said second outer insulator layer further having another portion that is formed on said second inner insulator layer.

2. The semiconductor package of claim 1, further comprising at least one conductive post extending outwardly from said first segment of said internal wiring through said first wire-connecting hole in said first outer insulator layer.

3. The semiconductor package of claim 1, wherein each of said first and third segments of said internal wiring includes a layer of a conductive paste and a layer of metal formed on said conductive paste.

4. The semiconductor package of claim 1, wherein said bonding pad is provided with a metal layer thereon, said first segment of said internal wiring being connected to said metal layer.

5. A method for making semiconductor packages, comprising:

forming a first inner insulator layer on a pad-mounting face of a semiconductor substrate;

forming a plurality of pad-aligned holes and a plurality of side holes in the first inner insulator layer such that the pad-aligned holes expose bonding pads on the pad-mounting face of the semiconductor substrate, respectively, and that the side holes are disposed respectively at cutting lines of the semiconductor substrate;

forming a wire-defining layer on the first inner insulator layer;

forming a plurality of wire-defining holes in the wire-defining layer such that each of the wire-defining holes extends between and communicates spatially with a respective one of the pad-aligned holes and a respective one of the side holes;

forming a plurality of through-holes in the semiconductor substrate such that each of the through-holes communicates spatially with a respective one of the side holes and extends through a rear face of the semiconductor substrate opposite to the pad-mounting face;

forming a plurality of first conductive traces such that each of the first conductive traces fills a respective one of the pad-aligned holes to connect with a respective one of the bonding pads, and further fills a respective one of the wire-defining holes, a respective one of the side holes, and a respective one of the through-holes;

forming a second inner insulator layer on the rear face of the semiconductor substrate;

forming a plurality of wire-extension holes in the second inner insulator layer such that each of the wire-extension holes communicates spatially with a respective one of the through-holes;

forming a plurality of second conductive traces such that each of the second conductive traces fills a respective one of the wire-extension holes to connect with a respective one of the first conductive traces;

forming a first outer insulator layer to cover the wire-defining layer and the first conductive traces;

forming a plurality of wire-connecting holes in the first outer insulator layer to expose portions of the first conductive traces, respectively;

forming a second outer insulator layer to cover the second inner insulator layer and the second conductive traces;

forming a plurality of wire-connecting holes in the second outer insulator layer to expose portions of the second conductive traces, respectively;

forming a plurality of conductive posts such that each of the conductive posts fills a respective one of the wire-connecting holes in the first outer insulator layer to connect with a respective one of the first conductive traces and extends outwardly of the respective one of the wire-connecting holes in the first outer insulator layer; and cutting an assembly of the first and second inner insulator layers, the first and second outer insulator layers, the wire-defining layer, the first and second conductive traces, the conductive posts, and the semiconductor substrate along the cutting lines so as to form the semiconductor packages.

6. The method of claim 5, further comprising forming a metal layer on each of the bonding pads prior to formation of the wire-defining layer.

7. The method of claim 5, wherein each of the first conductive traces is formed by filling the respective one of the pad-aligned holes, the respective one of the wire-defining holes, the respective one of the side holes, and the respective one of the through-holes with a conductive paste, followed by forming a layer of metal on a portion of the conductive paste that fills the respective one of the pad-aligned holes and the respective one of the wire-defining holes.

* * * * *